United States Patent [19]

Mammano

[11] 4,379,240
[45] Apr. 5, 1983

[54] LATCHING PULSE WIDTH MODULATION COMPARATOR

[75] Inventor: Robert A. Mammano, Costa Mesa, Calif.

[73] Assignee: Silicon General, Inc., Garden Grove, Calif.

[21] Appl. No.: 179,538

[22] Filed: Aug. 19, 1980

[51] Int. Cl.³ .............................................. H03K 5/24
[52] U.S. Cl. .................................... 307/356; 307/265; 307/288
[58] Field of Search ............... 307/355, 356, 265, 530, 307/288, 290; 328/146, 147, 149

[56] References Cited

U.S. PATENT DOCUMENTS 4,151,516 4/1979 O'Neill ................................ 307/355

Primary Examiner—John Zazworsky
Attorney, Agent, or Firm—Spensley, Horn, Jubas & Lubitz

[57] ABSTRACT

A pulse width modulation comparator having internal latching and resetting functions. The comparator includes a differential input stage having first and second outputs which are connected to supply first and second transistors in a voltage gain stage, respectively. The first output of the input stage drives both of the transistors of the voltage gain stage. The second output of the input stage is connected to drive an output transistor as well as to supply the second transistor of the voltage gain stage. The output of the output transistor is connected via feedback circuitry to drive the transistors of the voltage gain stage. A shunt transistor forms part of the feedback circuit and serves to divert the feedback signal from the voltage gain stage transistors upon the application of a clock reset pulse.

An analog voltage is applied to one input of the input stage and a ramp or triangular waveform is applied to the other input. At the point where the ramp exceeds the analog voltage, the voltage gain transistors are turned on and the second output of the input stage goes low, aided by the voltage gain stage. This causes the output transistor to go high, thereby generating positive feedback to drive the voltage gain transistors, thereby latching the output transistor in a high state. At the end of the ramp period, a clock pulse turns on the shunt transistor so as to remove the feedback current from the voltage gain stage and reset the output transistor to a low level.

14 Claims, 2 Drawing Figures

4,379,240

LATCHING PULSE WIDTH MODULATION COMPARATOR

BACKGROUND OF THE INVENTION

1. Field of the Invention

This invention relates to a comparator circuit and more particularly to a comparator used as a pulse width modulator (PWM). In such applications, a periodic waveform such as a ramp or triangular voltage is compared to an analog input voltage. The width of the output pulse generated during each period of the repetitive waveform is proportional to the value of the analog input signal. The digital pulse width is defined by that portion of the repetitive waveform which is less than (or greater than) the analog voltage, with output switching occurring when the ramp or triangle wave crosses the level of the analog voltage. The present invention is directed to a comparator which includes latching circuitry to eliminate multiple pulsing or output jitter caused by noise, oscillation, or threshold ambiguity at or near the point where the repetitive waveform crosses the analog voltage level.

2. Description of the Prior Art

Heretofore, two different ways of eliminating the multiple pulsing problems in pulse width modulators have been employed. The first method is to add low pass filters to either or both inputs to the comparator. This approach suffers by severely limiting the dynamic response of the system.

The second approach is to connect the comparator output to a flip-flop which changes state with the first output transition of the comparator and thereby ignores any further switching of the comparator. The flip-flop is reset with a clock pulse at the completion of each period of the repetitive waveform, allowing the cycle to repeat with the next period. This method is effective but suffers from the added complexity of the required flip-flop.

Several patents disclose pulse width modulators which utilize some type of feedback arrangement. U.S. Pat. No. 3,866,146 to Van Mourik discloses a pulse width modulator which essentially comprises an integrator having its output connected to one input of a differential amplifier. A first input voltage is connected to the input of the integrator and a second input voltage is connected to the other input of the differential amplifier. The output of the circuit is a pulse having a pulse width proportional to the quotient of the two inputs. When the output voltage changes, a feedback circuit causes a pulse to be generated which discharges the integrator in order to reset the modulator. In addition, feedback is utilized to stabilize the output of the modulator while the integrator is being discharged. Although the modulator disclosed in Van Mourik shows the use of feedback to provide stabilization, the circuit has slow dynamic response due to the use of an integrator and is not designed to function by comparing an unknown analog voltage with a constant frequency ramp or triangular waveform.

Other pulse width modulators employing some type of feedback are shown in U.S. Pat. Nos. 3,277,395 to Grindle et al, 3,393,363 to Forster, Jr. and 3,708,765 to Salamon, et al. However, none of the circuits shown in these patents utilize feedback to provide a latching function. In addition, most feedback circuits have an adverse effect upon the input characteristics of the device.

SUMMARY OF THE INVENTION

The present invention is directed to a comparator circuit which can be used as a pulse width modulator and which includes internal feedback circuitry that provides latching and resetting functions which are equivalent in function to the prior art devices which incorporate a flip-flop connected to the output of the comparator. The comparator circuit includes a differential input stage, a voltage gain stage, and an output stage. The differential input stage includes two sides, one of which is connected to an analog voltage input and the other of which is connected to a periodic ramp or triangular voltage. The input stage is provided with a constant current supply and only one side of the input stage will be conducting at a time. The voltage gain stage includes a pair of transistors, one of which is supplied by the output of one side of the differential input stage and the other of which is supplied by the output of the other side of the input stage. Both of the transistors are driven by the output of a first side of the input stage transistors. As the first side conducts, the transistors in the voltage gain stage are turned on and cause the other side of the input stage to turn off. During this switching process, the output of the output stage will switch from a first state to a second state. This output is connected via a feedback resistor to drive the voltage gain stage. Once the output of the output stage switches, the positive feedback through the feedback resistor will drive the voltage gain stage transistors, thereby maintaining them conductive irrespective of the inputs to the input stage. Thus, the output of the comparator will be positively latched in the second state for the remainder of the ramp or triangle period, thereby eliminating noise jitter or multiple pulsing.

The positive feedback is isolated from the input stage by means of a diode connected between the output of the first side of the input stage and the transistors in the voltage gain stage. A shunt transistor is connected to remove the positive feedback from the voltage gain stage transistors at the end of the ramp or triangle period. The shunt transistor is controlled by means of a clock signal which is synchronized with the ramp or triangle waveform. The inclusion of the shunt transistor provides automatic resetting of the comparator circuit at the end of each ramp or triangle period. The feedback resistor, diode, and shunt transistor comprise a feedback network which facilitates latching and resetting in the comparator in a very simple circuit which can be easily implemented as a monolithic IC.

DESCRIPTION OF THE PREFERRED EMBODIMENT

Figure 1:
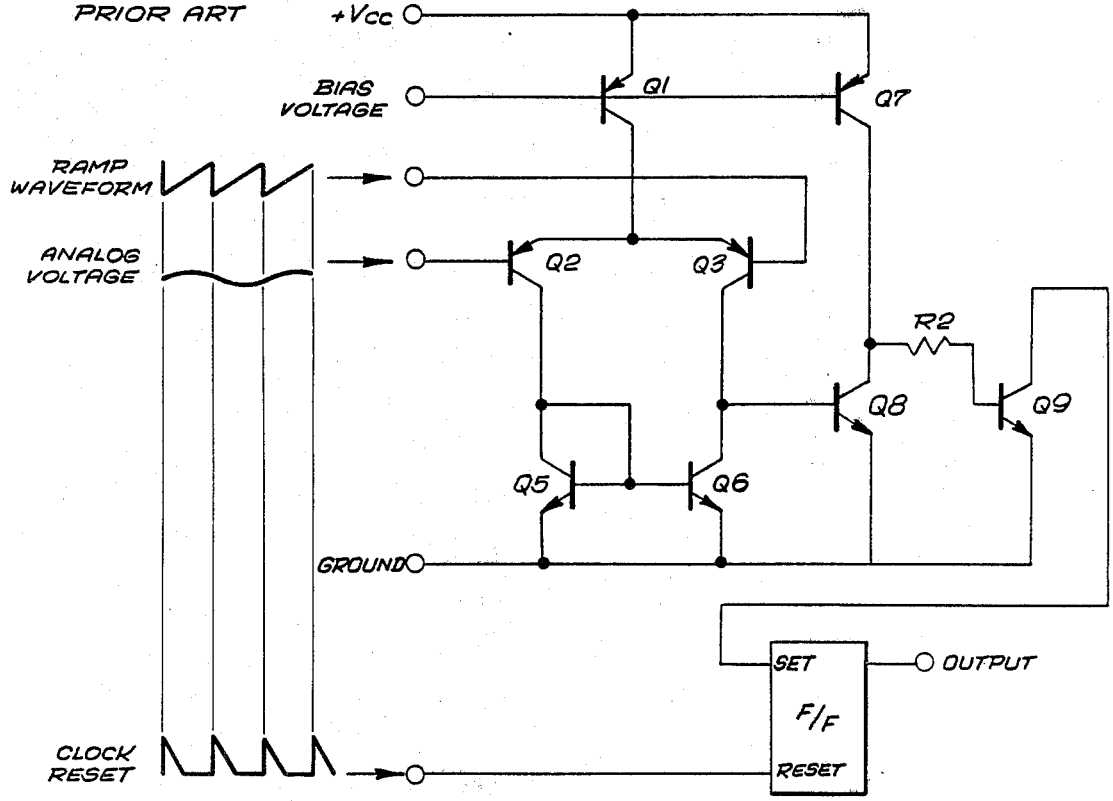
FIG. 1 is a circuit diagram of a prior art pulse width modulator comparator circuit utilizing a flip-flop to provide latching and reset capability.

Referring to FIG. 1, a conventional comparator circuit includes transistors Q1 and Q7 which are biased to provide constant current operation. Q2 and Q3 form two sides of the comparator input stage, and their collectors are connected to the collectors of transistors Q5 and Q6, respectively. The transistors Q5 and Q6 form a voltage gain stage and are both driven by the collector output of the transistor Q2. Q8 forms the output stage of the comparator and R2 and Q9 form an optional output buffer. The output of Q9 is connected to a flip-flop F/F which is reset by means of a clock pulse.

One input to the comparator is a ramp or triangular waveform while the other input is an analog voltage having a relatively constant value. As soon as the ramp voltage exceeds the analog voltage, the output of the transistor Q9 will go high and set the flip-flop F/F, thereby latching the output of the comparator in a high state. The flip-flop F/F will be reset upon the occurrence of a clock pulse, which is synchronized with the ramp waveform. The use of the flip-flop F/F prevents the occurrence of any multiple pulses during a period regardless of input noise (i.e., fluctuation of the analog input voltage) or other disturbance.

Figure 2:
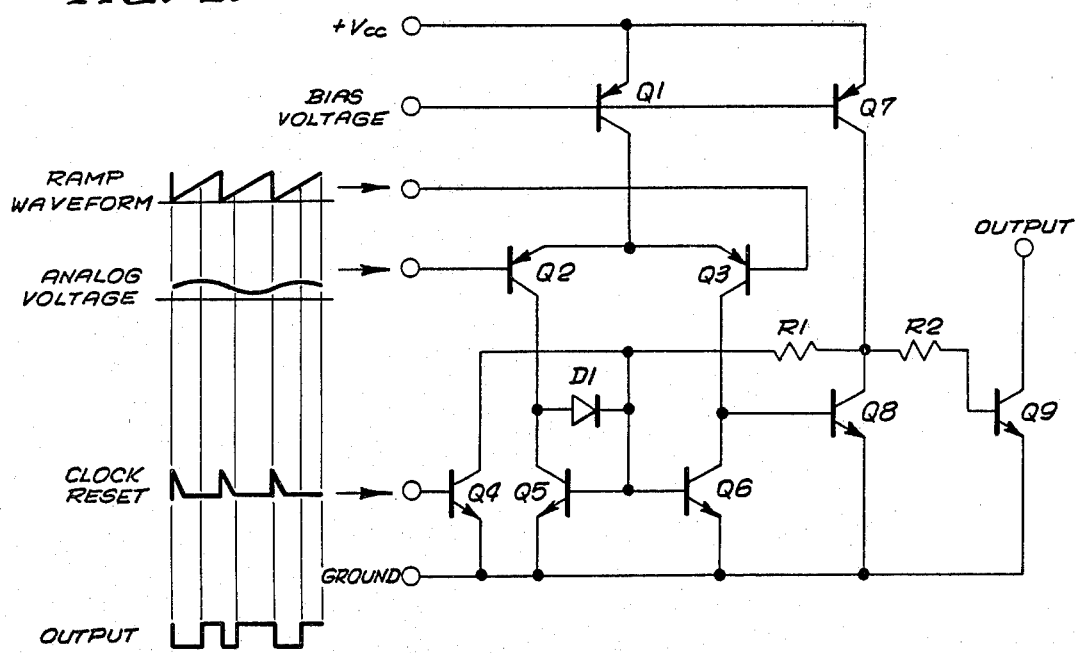
FIG. 2 is a circuit diagram of the comparator circuit of the present invention providing internal latching and reset functions.

Referring now to FIG. 2, the present invention eliminates the need for a flip-flop by adding a resistor R1, diode D1, and transistor Q4 to the conventional comparator circuit. The transistors Q2 and Q3 comprise a PNP differential front end and, although each side is shown as having only a single transistor, darlington pairs can be employed to provide higher input impedance. Whichever of the transistors Q2 and Q3 has the lower input will be conducting, while the other transistor will be non-conducting. Initially, the ramp waveform will be less than the analog voltage and the transistor Q3 will be conducting. When the ramp waveform exceeds the unknown analog voltage, Q3 will turn off and Q2 will begin conducting. The turning on of Q2 will turn on the transistors Q5 and Q6 through the diode D1. The transistors Q5 and Q6 comprise an NPN voltage gain stage. As Q2 is turned on and begins to conduct, the turning on of Q6 will rapidly pull down the voltage on the collector of Q3. This reduction in voltage will turn off the transistor Q8, causing its collector voltage to rise. This causes a positive feedback current to flow through the resistor R1 and to the bases of Q5 and Q6. The feedback current will then drive transistors Q5 and Q6 despite any fluctuations in the output of the transistor Q2 due to changes in the analog voltage input or otherwise. The diode D1 serves to isolate the positive feedback current from the transistor Q2.

The transistor Q4 provides for automatic resetting of the comparator circuit at the beginning of each ramp period. A clock pulse will be generated which turns on Q4 and causes it to divert the positive feedback current away from the bases of Q5 and Q6. Since at the beginning of the ramp period, the analog input is greater than the ramp value and therefore Q2 will not be conducting, the turning on of Q4 will remove any base drive to Q5 and Q6, thus causing the output of the comparator to switch back to its original state.

Thus, as soon as the transistor Q2 begins conducting, the transistor Q3 will turn off, aided by the transistor Q6 turning on. The reduction of the collector voltage of the transistor Q3 turns off the transistor Q8 of the output stage, increasing its collector voltage and causing a positive feedback current to latch Q5 and Q6 in a conducting state. The latching of Q5 and Q6 will keep the collector voltage of the transistor Q8 high despite any noise, oscillation, or threshold ambiguity at the comparator input which would otherwise cause multiple pulsing. At the end of the ramp period, the turning on of the transistor Q4 removes drive current from the bases of Q5 and Q6 and Q3 turns on, thereby turning on Q8 and resetting its collector voltage to its original value.

Thus, by the addition of three circuit components, internal latching and resetting is provided without the need for a flip-flop following the comparator output.

The circuit configuration of the present invention is ideally suited to facilitate implementation as a monolithic integrated circuit. The elimination of the need for a flip-flop circuit greatly reduces the circuit complexity. The circuit provides a positive guarantee of only one output pulse per ramp period regardless of input noise or other disturbance. This latching capability is provided without effecting any input characteristics of the comparator such as lowered impedance levels or changed threshold. Generally, the invention comprises a comparator circuit including a differential input stage connected to a high gain active load (the voltage gain stage) and an output stage. A positive feedback network is provided between the output stage and the voltage gain stage which causes the transistors in the voltage gain stage to be turned on as soon as the ramp waveform exceeds the analog voltage and remain turned on until the end of the ramp period. At that point, a clock pulse is generated to turn on a transistor which shunts the feedback current away from the voltage gain stage so as to reset the comparator.

Although the invention has been described in terms of a single embodiment, it should be appreciated that variations and modifications will occur to those skilled in the art. For example, the NPN transistors could be replaced with PNP transistors and vice-versa for operation with negative supply voltages. In addition, the output buffer stage (R2 and Q9) may or may not be used, depending upon the particular application. Therefore, it is intended that the scope of the invention not be limited to the particular description given.

I claim:
1. A comparator circuit having integral latching and resetting, comprising:
   a differential input stage having first and second sides which are driven by first and second input signals, respectively, whereby when one of said sides is conducting, the other of said sides is not conducting, each of said sides having an output;
   a voltage gain stage including first and second transistors which are connected to be supplied by said outputs of said first and second sides of said input stage, respectively, said first and second transistors having drive inputs which are connected to be driven by said output of said first side of said input stage;
   an output stage connected to be driven by said output of said second side of said input stage, said output stage having an output; and
   a positive feedback network connected from said output of said output stage to provide positive feedback to drive said first and second transistors of said voltage gain stage, said feedback network including circuitry for removing said positive feedback from said first and second transistors upon application of a reset signal.
2. The circuit of claim 1, wherein said positive feedback network includes:
   a diode connected between said output of said first side of said input stage and said drive inputs of said first and second transistors, said diode isolating said positive feedback from said input stage.
3. The circuit of claim 1 or 2, wherein said circuitry for removing said positive feedback comprises:

a shunt transistor supplied by the positive feedback current and driven by said reset signal, the application of said reset signal causing said shunt transistor to conduct the positive feedback current away from said first and second transistors.

4. The circuit of claim 1, wherein said comparator circuit is a pulse width modulation comparator, said first input signal is an analog voltage for which a proportional pulse width signal is desired, said second input signal is a periodic voltage, and said reset signal is a clock signal which is synchronized with said second input signal.

5. The circuit of claim 4, wherein said second input signal is a ramp signal.

6. The circuit of claim 1, wherein each side of said input stage comprises a single transistor.

7. The circuit of claim 6, wherein said transistors in said input stage are of a type which is different from the type of said transistors in said voltage gain stage.

8. A pulse width modulation comparator for comparing an analog voltage with a periodic voltage, comprising:
a differential input stage including first and second sides, each side including a transistor connected to a supply current, said transistor on said first side being driven by said analog voltage and said tranistor on said second side being driven by said periodic voltage, each of said sides having an output;
a voltage gain stage including a first transistor supplied by said output of said transistor of said first side of said input stage and a second transistor supplied by said output of said second side of said input stage, said first and second transistors having drive inputs which are driven by said output of said first side of said input stage;
an output stage connected to said output of said second side of said input stage, said output stage having an output; and
a positive feedback network including a resistor connected to supply positive feedback current from said output of said output stage to said drive inputs of said first and second transistors, a diode connected between said output of said first side of said input stage and said drive inputs of said first and second transistors, said diode isolating said feedback current from said input stage, and a shunt transistor having a supply input connected to said resistor and a drive input connected to a clock voltage which is synchronized with said periodic voltage, whereby when said periodic voltage exceeds said analog voltage, said first and second transistors will initially be turned on by said output of said first side of said input stage, thereby causing said output of said output stage to go high and drive said first and second transistors through said resistor, and wherein a clock pulse subsequently causes said shunt transistor to conduct and divert said positive feedback current away from said first and second transistors to thereby reset said comparator.

9. The comparator of claim 8, wherein said periodic voltage is a ramp voltage.

10. The comparator of claim 9, wherein said periodic voltage is a triangle voltage.

11. The comparator of claim 8, wherein said transistors in said input stage are of a type which is different from the type of said transistors in said voltage gain stage.

12. The comparator of claim 1 or 8, further including:
an output buffer stage connected to said output of said output stage.

13. A pulse width modulation comparator providing latching and resetting functions, comprising:
a differential input stage having an analog voltage as a first input and a periodic voltage as a second input, said input stage having first and second outputs, wherein the value of said outputs is a function of the difference between said analog voltage and said periodic voltage;
first and second transistors connected to be supplied by said first and second outputs, respectively, said first and second transistors having drive inputs which are connected to be driven by said first output, the turning on of said transistors aiding in the switching of said second output from a high level to a low level;
an output stage driven by said second output, said output stage having an output; and
a positive feedback circuit for providing a positive feedback drive current from said output of said output stage to said drive inputs of said transistors, said feedback current latching said output of said output stage, said feedback circuit including circuitry for selectively removing said feedback current from said transistors.

14. The comparator of claim 13, wherein said circuitry for removing includes a shunt transistor which is turned on to shunt feedback current away from said transistors and wherein said shunt transistor is driven by a clock signal which is synchronized with said periodic voltage.

* * * * *